United States Patent [19]
Fukuzawa et al.

[11] Patent Number: 5,157,543
[45] Date of Patent: Oct. 20, 1992

[54] OPTICAL BEAM DEFLECTOR

[75] Inventors: Tadashi Fukuzawa, Tokyo; Satoru S. Kano, Yokohama; Yutaka Takahashi, Tokyo, all of Japan

[73] Assignee: International Business Machines Corporation, Armonk, N.Y.

[21] Appl. No.: 625,290

[22] Filed: Dec. 10, 1990

[30] Foreign Application Priority Data

Dec. 8, 1989 [JP] Japan .................................. 1-317914

[51] Int. Cl.$^5$ ........................ G02B 26/00; G02B 6/12; G02F 1/29; G02F 1/295
[52] U.S. Cl. .................. 359/298; 359/318; 385/10; 385/14; 385/129
[58] Field of Search ............... 359/247, 248, 250, 251, 359/255, 256, 318, 321, 298, 299, 300, 301, 302, 572, 569; 357/17, 40, 4; 385/10, 14, 129, 130, 131, 4

[56] References Cited

U.S. PATENT DOCUMENTS

| | | | |
|---|---|---|---|
| 4,639,073 | 1/1987 | Yip et al. | 359/315 |
| 4,755,015 | 7/1988 | Uno et al. | 385/131 |
| 4,973,121 | 11/1990 | Brophy et al. | 385/10 |

FOREIGN PATENT DOCUMENTS

| | | |
|---|---|---|
| 62-027767 | 8/1988 | Japan . |
| 63-202723 | 8/1988 | Japan . |
| 63263453 | 4/1990 | Japan . |

OTHER PUBLICATIONS

G. J. Sonek, et al., Modal Dispersion of GaAs/AlGaAs Multiple Quantum Well Waveguides, Feb. 1986, pp. 18–19, 1986 Integrated and Guided Wave Optics, Technical Digest, Paper WDD4.

X. Cheng, et al., Electrooptic Bragg-Diffraction Modulators in GaAs/AlGaAs Heterostructure Waveguides, Jun. 1988, pp. 809–817, Journal of Lightwave Technology, vol. 6, No. 6, Jun. 1988, New York US, Sections II, V; Figure 1.

S. Mukai et al. Numerical Analysis of a Twin-striped AlGaAs Doubleheterostructure Deflector, Extended Abstracts (48th Autumn Meeting, 1987): Japan Society of Applied Physics, No. 3, 19p-ZL-3, p. 639 (translation enclosed).

S. Mukai et al. Beam Waist Position Variable Diode Laser Integrated with Carrier Injection Type Lens, Extended Abstracts (35th Spring Meeting, 1988): Japan Society of Applied Physics and Related Societies, No. 3, 29a-ZP-7, p. 863 (translation enclosed).

Primary Examiner—Eugene R. LaRoche
Assistant Examiner—Evelyn A. Lester
Attorney, Agent, or Firm—David Aker

[57] ABSTRACT

An apparatus for changing the direction of an optical beam comprises a thin film grating deflector; an optical energy source for providing optical energy to strike the deflector at a first angle with respect to gratings of the deflector and to exit the deflector at a second angle with respect to the gratings; and elements for applying a voltage to the deflector to vary the second angle. The optical energy source preferably comprises a laser diode; and a collimator for coupling energy from the laser diode to the grating deflector. The grating deflector is a planar waveguide including a plurality of stacked quantum wells formed of GaAs separated by barriers of AlGaAs. Optical energy provided to the grating deflector in a first direction is deflected in a second direction. These directions define a plane in which the waveguide is disposed. The quantum wells are stacked in a direction perpendicular to a plane of the waveguide. The optical energy source, the thin film grating deflector, the voltage applying elements and the collimator may be integrated into a single chip.

18 Claims, 8 Drawing Sheets

OPTICAL BEAM DEFLECTOR

TECHNICAL FIELD

This invention relates to optical devices for data processing or data storage, or for a printer that requires optical beam scanning. More particularly, this invention relates to solid state quantum optical beam deflectors.

BACKGROUND ART

Optical beam scanning is essential in a laser beam printer wherein a modulated laser beam is deflected by a rotating polygonal mirror to form image patterns or alphabet characters. However, the scanning speed is relatively slow, as it is limited by the movement of optical elements. In addition, the scanning drive mechanism takes up a relatively large portion of the volume of the enclosure. These disadvantages are inherent in optical beam scanning as long as it must use mechanical movement of the elements. A high-speed beam scanner which can be compactly packaged has long been required for optical data processing generally, and for printer applications in particular.

High-speed scanning of a light beam has been realized by using an electro-optic modulator or an acousto-optic modulator. However, these devices require a high-voltage lamp or chirping of a radio-frequency signal, respectively. Conventional optical beam deflectors are described in:

S. Mukai et al.: Extended Abstracts (48th Autumn Meeting, 1987): Japan Society of Applied Physics, No. 3, 19p-ZL-3, p.639 and S. Mukai et al.: Extended Abstracts (35th Spring Meeting, 1988): Japan Society of Applied Physics and Related Societies, No. 3, 29a-ZP-7, p.863

Several techniques for integrating a semiconductor laser with an optical beam scanner have been reported. These scanners are based on the band filling effect, i.e. changes in the refractive index are controlled by current injection. The laser beam passes through a window region adjacent to the output end of an oscillator region. The spatial distribution of the current injection through electrodes in the window region, and consequently that of the refractive index in the region, is made asymmetric, and thus the output beam is deflected. However, when this technique is used, the distortion of the output beam profile is greater than can be tolerated, since the window region is generally not an ideal lens. The control function or mechanism (i.e. circuitry) needed to implement the control function may not be simple enough for practical application, due to the complexity of the relationship between the injected current and the deflection angle.

DISCLOSURE OF THE INVENTION

It is an object of the invention to eliminate the disadvantages of conventional beam deflectors by integrating a semiconductor laser and a high-speed beam deflector on the same chip.

It is an additional object of the invention to provide an optical beam deflector that has a good beam profile, ultra-fast response time, and linearity of the deflection angle as a function of the control signal.

In accordance with the invention there is provided an apparatus for changing the direction of an optical beam comprising a thin film grating deflector; optical energy providing means for providing optical energy to strike said deflector at a first angle with respect to gratings of said deflector and to exit said deflector at a second angle with respect to said gratings; and voltage applying means for applying a voltage to said deflector to thereby vary the second angle.

The optical energy providing means comprises a laser diode; and means for coupling energy from the laser diode to the grating deflector. The grating deflector comprises a plurality of quantum wells. The quantum wells are preferably comprised of GaAs separated by barriers of AlGaAs. Thus, the quantum wells are modulation doped structures and are formed as a superlattice.

The thin film grating deflector is a planar waveguide. A collimator means is disposed between the optical energy providing means and the grating deflector to collimate the optical energy. The optical energy is provided to the grating deflector in a first direction and it is deflected by the grating deflector in a second direction. The first direction and the second direction define a plane in which the waveguide is disposed.

In accordance with the invention, the optical energy producing means, the thin film grating deflector, the voltage applying means and the collimator may be integrated into a single chip. The voltage applying means may include one of a Schottky contact and a pn junction.

BEST MODES FOR CARRYING OUT THE INVENTION

Figure 1:
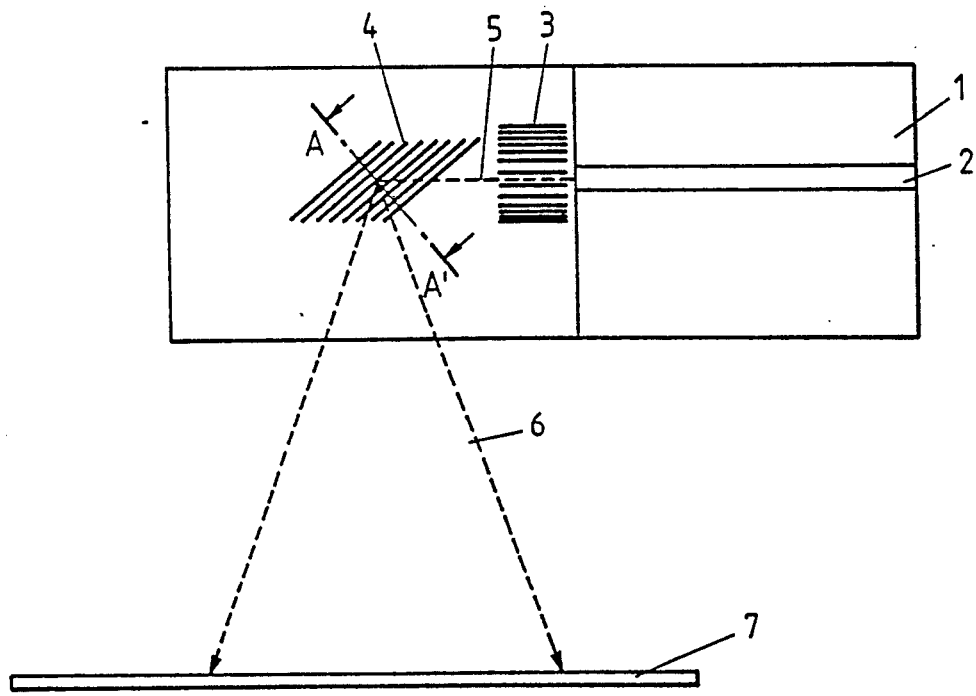
FIG. 1 is a cross-sectional plan view illustrating an optical deflector according to the invention, and its use.

FIG. 1 is a cross-sectional view of a chip 100 on which the components of the invention are integrated. Chip 100 has a laser containing section 1A and a beam deflecting section 1B. Section 1A includes a laser diode 2 having a lateral mode confinement structure. Light from laser diode 2 is coupled into deflecting section 1B wherein grating deflector 4 deflects the laser beam 5. The deflected beam 6 is directed to a focal plane 7.

Beam deflecting section 1B has a slab waveguide structure (a two-dimensional optical waveguide), including a holographic collimator 3 and grating deflector 4. The output beam 5 from laser diode 2, which would diverge (due to aperture diffraction) in the slab waveguide at an angle determined by the size of the waveguide in laser containing section 1A and by the refractive indices of the relevant parts, is collimated by the holographic collimator 3 (a grating or lens) to become a parallel beam so that it can properly couple into grating deflector 4.

The periodic change of the dielectric constant $\Delta\epsilon$, which determines the coupling efficiency, is written as follows if the Y-Z plane is assumed to be the plane of the waveguide:

$$\Delta\epsilon(x,y,z) = \Sigma \Delta\epsilon_q(x)\exp(-jqK^*r) \quad (1)$$

where $$K = K_y e_y + K_z e_z, \quad (2)$$

and $$r = y e_y + z e_z \quad (3)$$

Here K is the grating vector determined by the grating period ($|K| = K = 2\pi/\lambda$); $e_y$ and $e_z$ unit vectors in the y- and z-directions, respectively; and q is the order of diffraction. The direction of the grating rules is determined by the Bragg condition as follow:

$$\beta_d \sin\theta_d = \beta_i \sin\theta_i + qK\sin\phi \quad (4)$$

and $$\beta_d \cos\theta_d = \beta_i \cos\theta_i + qK\cos\phi \quad (5)$$

where $\beta_i$ and $\beta_d$ are mode propagation constants of the incident and diffracted modes, respectively; $\theta_i$ and $\theta_d$ are the incident and deflected angles at the grating, respectively; and $\phi$ is the angle between the grating vector and the Z-axis.

A different value of the mode propagation constant $\beta_d$ causes a different deflection angle $\theta_i$. The deflection angle is a function of the refractive index which is controlled by the injected current. The response time for a change in the refractive index is estimated to be less than one nanosecond.

Figure 2:
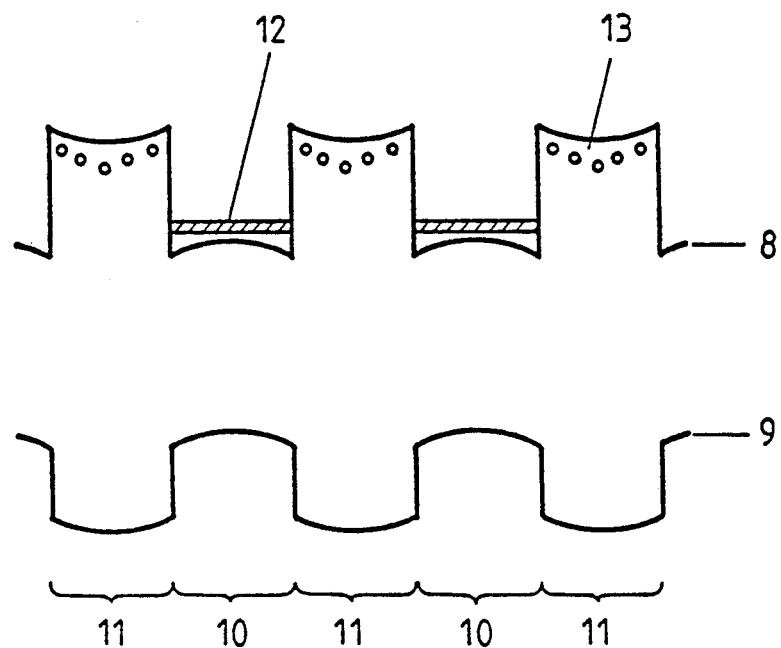
FIG. 2 is a band diagram of a quantum well after modulation doping to produce a superlattice structure in accordance with the invention.

As more fully described below, grating deflector 4 is formed of a series of modulation doped Multi Quantum Wells (MQW's). FIG. 2 schematically illustrates the band diagram of a modulation-doped superlattice, grown by molecular beam epitaxy (MBE), with a conduction band 8 and a charged electron band 9. Silicon donor impurities 102 are doped into only the AlGaAs barrier layers 11. Two-dimensional electrons 12 in GaAs MQW layers 10 are supplied from donors in the barrier layers. The well width is 90 Å and the barrier width is 100 Å.

Figure 3:
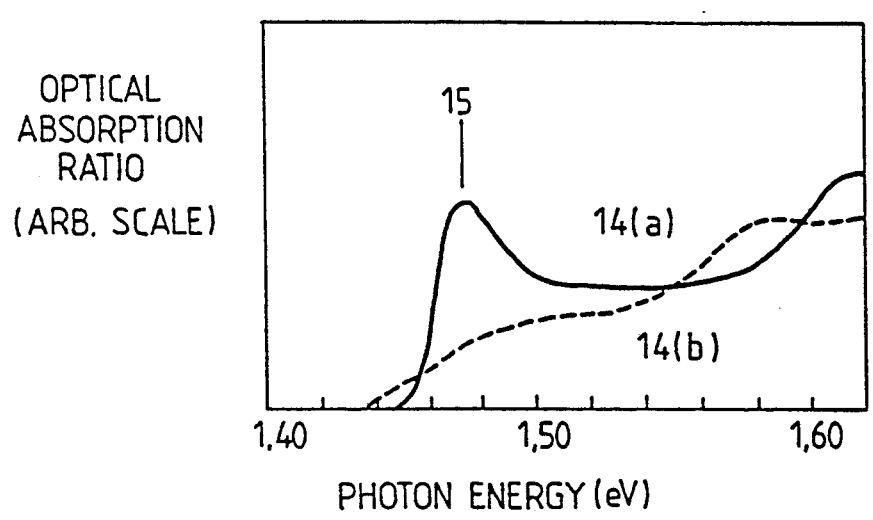
FIG. 3 is an absorption spectrum diagram of a quantum well after modulation doping.

FIG. 3 shows the absorption spectra of the modulation-doped MQW structure and is useful in explaining how the refractive index of the waveguide grating is varied. The dotted line 14B is the absorption spectrum of the MQW without electrical bias.

When a sufficiently high negative bias is applied by using a Schottky electrode or a p-n junction, electrons in the MQW layers are fully depleted. This means that the two-dimensional electrons 12 are swept away from the MQW. The absorption spectrum of the modulation-doped MQW in this condition is depicted by a continuous line 14a. The peak 15 on the low energy side corresponds to the exciton absorption. On the other hand, when the bias voltage at the Schottky electrode is positive (or when there is no bias voltage in the case of a p-n junction), the two-dimensional electrons can exist in MQW layers and affect the absorption spectrum, as shown by the dotted line 14b. A typical concentration of two-dimensional electrons without any bias is $2 \times 10^{11}$ cm$^{-2}$ in each layer, which bleaches excitons in the MQW structure.

The Kramers-Kronig relations set forth the manner in which the refractive index of MQW structures varies in accordance with the changes in the absorption spectrum. A large change in the refractive index can be expected near the exciton absorption peak 15.

Figure 4A:
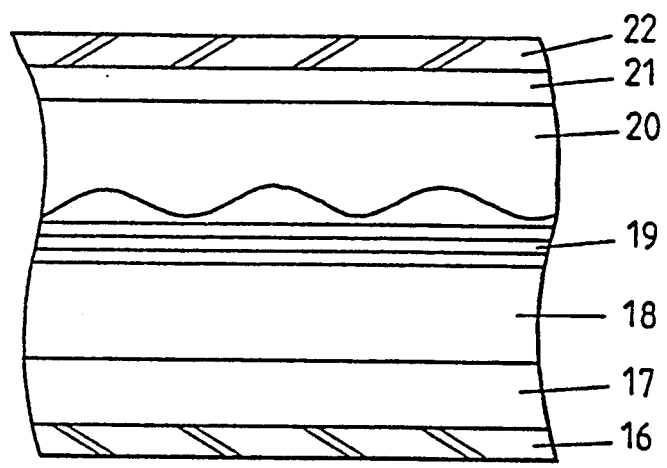
FIG. 4A is a partial cross-sectional view taken along line A—A' of FIG. 1 illustrating a first embodiment of the invention.
Figure 4B:
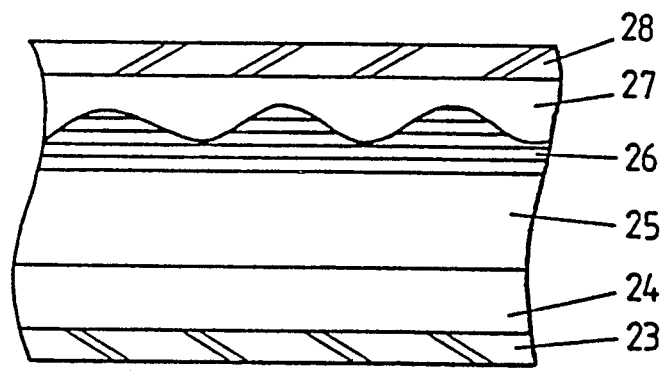
FIG. 4B is a partial cross-sectional view taken along line A—A' of FIG. 1 illustrating a second embodiment of the invention.

FIG. 4A and FIG. 4B, which are cross-sectional views of two embodiments of devices according to the invention taken along line A—A' of FIG. 1, illustrate the MQW's and their associated elements. In FIG. 4A and FIG. 4B respectively, 19 and 26 are modulation-doped MQW's (Multi Quantum Wells) having the structure illustrated in FIG. 2. Cladding layers 18, 20 (FIG. 4A) and 25, 27 (FIG. 4B) are formed on opposing sides of MQW's 19, thus defining the slab or planar optical waveguide.

Molecular beam epitaxy (MBE) growth is used to make the micro-hetero structures of FIG. 4A and FIG. 4B. Substrates 17 (FIG. 4A) and 24 (FIG. 4B) are formed of n-GaAs (100 crystal direction). Electrodes 16 and 23 are formed on the bottom of substrates 17 and 24, respectively.

In the case of FIG. 4A, depletion of the two-dimensional electron gas is accomplished by reversing the bias of the p-n junction, which consists of layer 18 (n-cladding) and layer 20 (p-cladding). A p-GaAs cap layer 21 makes good p-ohmic contact with an electrode 22.

In FIG. 4B, a Schottky metal contact 28 is formed on cladding layer 27 which is undoped. Applying an appropriate voltage causes depletion of the two-dimensional electron gas in the MQW structure.

Figure 5A:
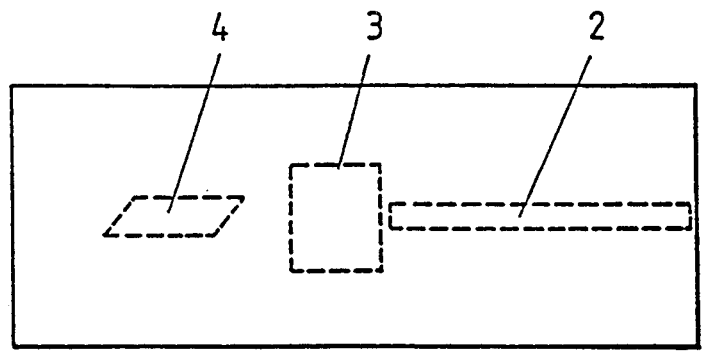
FIG. 5A is a plan view of a semiconductor device in accordance with the invention.
Figure 5B:
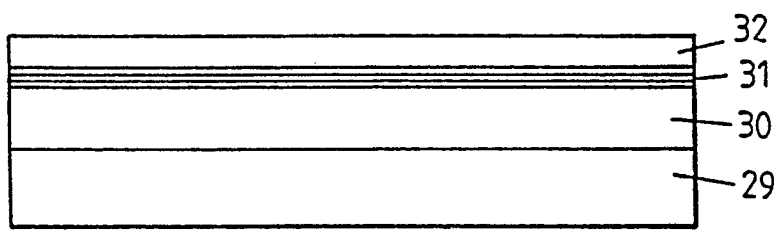
FIG. 5B is a side elevational view thereof.

FIGS. 5A to 5H illustrate the fabrication of a monolithic integrated laser-deflector in accordance with the invention. Referring to FIG. 5B MBE growth is performed on an n-GaAs substrate 29. First, an n-AlGaAs cladding layer 30 1 μm thick is grown. This layer corresponds to layer 18 in FIG. 4A and layer 25 in FIG. 4B. A modulation-doped MQW structure 31 of the type shown in FIG. 2 (and corresponding to 19 in FIG. 4A and 26 in FIG. 4B) and having a total thickness of 0.1 μm is then grown. Next, a p-AlGaAs layer 32 is grown to a thickness of 0.2 μm.

Figure 5C:
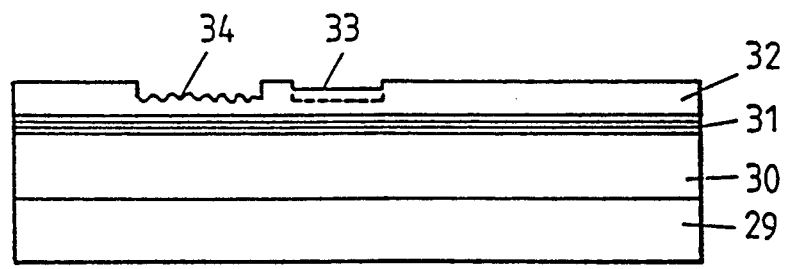
FIG. 5C is a side cross-sectional view thereof.
Figure 5D:
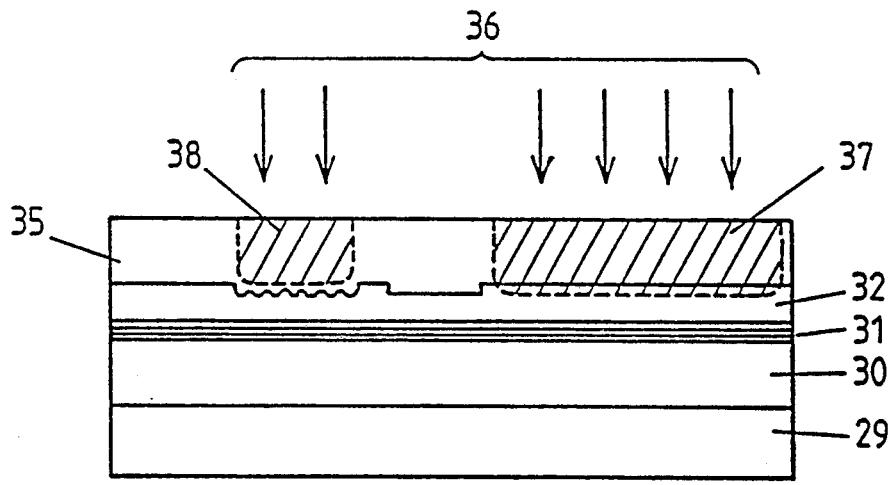
FIG. 5D is a cross-sectional view after a diffusion process has been conducted.

Referring to FIG. 5C, the gratings 33 of collimator 3 and the deflecting gratings 34 of grating deflector 4 are formed on layer 32 by means of electron beam lithography and a chemical or dry etching process and, as illustrated in more detail in FIG. 4A and FIG. 5B, extend to the MQW structure 31. The wafer is then moved into an MBE growth chamber, where a 0.1 μm p-AlGaAs cladding layer 35 is formed (FIG. 5D). Optionally, a p-GaAs cap layer, not shown in FIG. 5D (such as layer 21 of FIG. 4A), may be formed over layer 35. Layers 32 and 35 together correspond to cladding layer 20 of FIG. 4A, and cladding layer 27 of FIG. 4B which are shown as two separate layers, for purposes of illustration, in FIG. 5D.

Figure 5E:
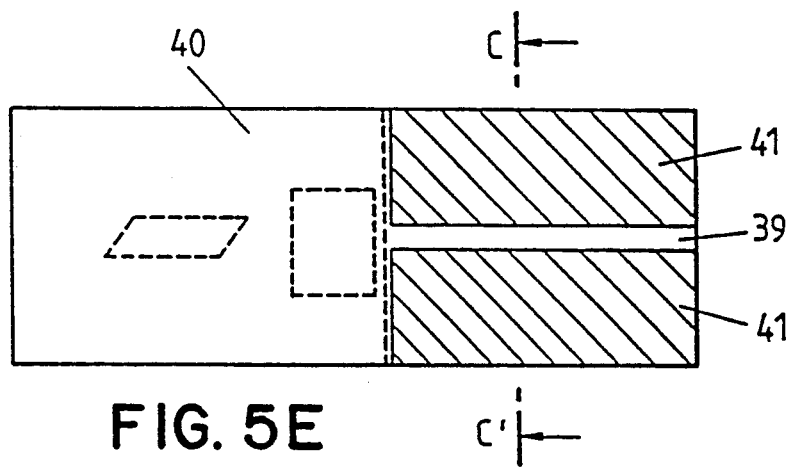
FIG. 5E is a top view thereof of the structure of FIG. 5D.
Figure 5F:
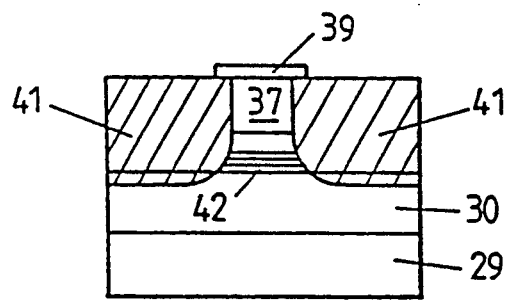
FIG. 5F is a cross-sectional view along line C—C' of FIG. 5E.

Referring again to FIG. 5D, ion implantation 36 is performed in regions corresponding to laser diode 2 and grating deflector 4 of FIG. 5A to form electrically conductive cladding regions 37 and 38, respectively. This is followed by a rapid annealing process to provide a pn forward bias for the region of laser diode 2 or a pn reverse bias for the region of beam deflector 4. To obtain lateral single-mode confinement for laser diode 2, Zn is diffused into regions 41, as illustrated in FIG. 5E and FIG. 5F. Coatings 39 and 40, which are masks to prevent diffusion of Zn into regions where no diffusion is intended, are applied prior to diffusion and are removed thereafter.

The portions of the MQW structure having Zn diffused therein are converted into mixed-alloy crystals of AlGaAs by diffusion-induced disordering of the MQW's. The channel of the MQW stripe between regions 41 becomes the optical waveguide for laser diode 2, which has an active laser region 42.

Figure 5G:
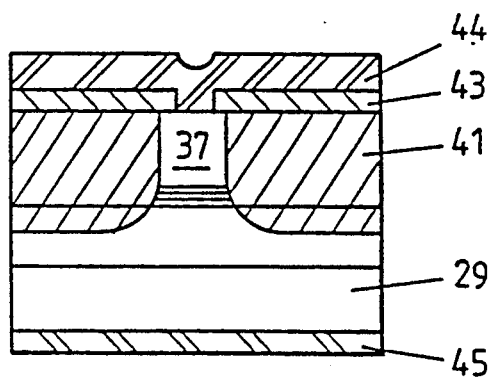
FIG. 5G is a cross-sectional view taken along in line C—C' after the formation of electrodes.
Figure 5H:
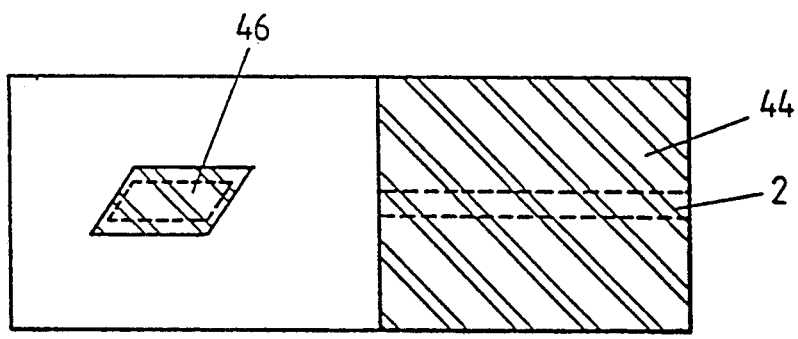
FIG. 5H is a plan view of the device of FIG. 5G.

Referring to FIG. 5G and FIG. 5H an $SiO_2$ and SiN passivation film 43 is deposited on the wafer. An electrode 44 for laser diode 2 and an electrode 46 for grating deflector 4 are formed by a conventional method and extend through respective openings in film 43.

An n- side electrode 45 (FIG. 5G) is formed after thinning the wafer by mechanical and chemical etching until it is approximately 120 $\mu$m thick. Cleaving, scribing, and bonding processes are performed by conventional laser diode fabrication methods.

EXAMPLE 1

A laser diode 2, having a 25-mA laser threshold current, oscillates at 790 nm to produce an output power of 30-mW. The laser output beam is collimated by the grating lens or collimator 3 and has a 45° incident angle with respect to the grating deflector. The deflected beam which exits from the side edge of chip 100 is measured through an external cylindrical lens, having a focal plane perpendicular to that of the waveguide plane of chip 100.

Figure 6:
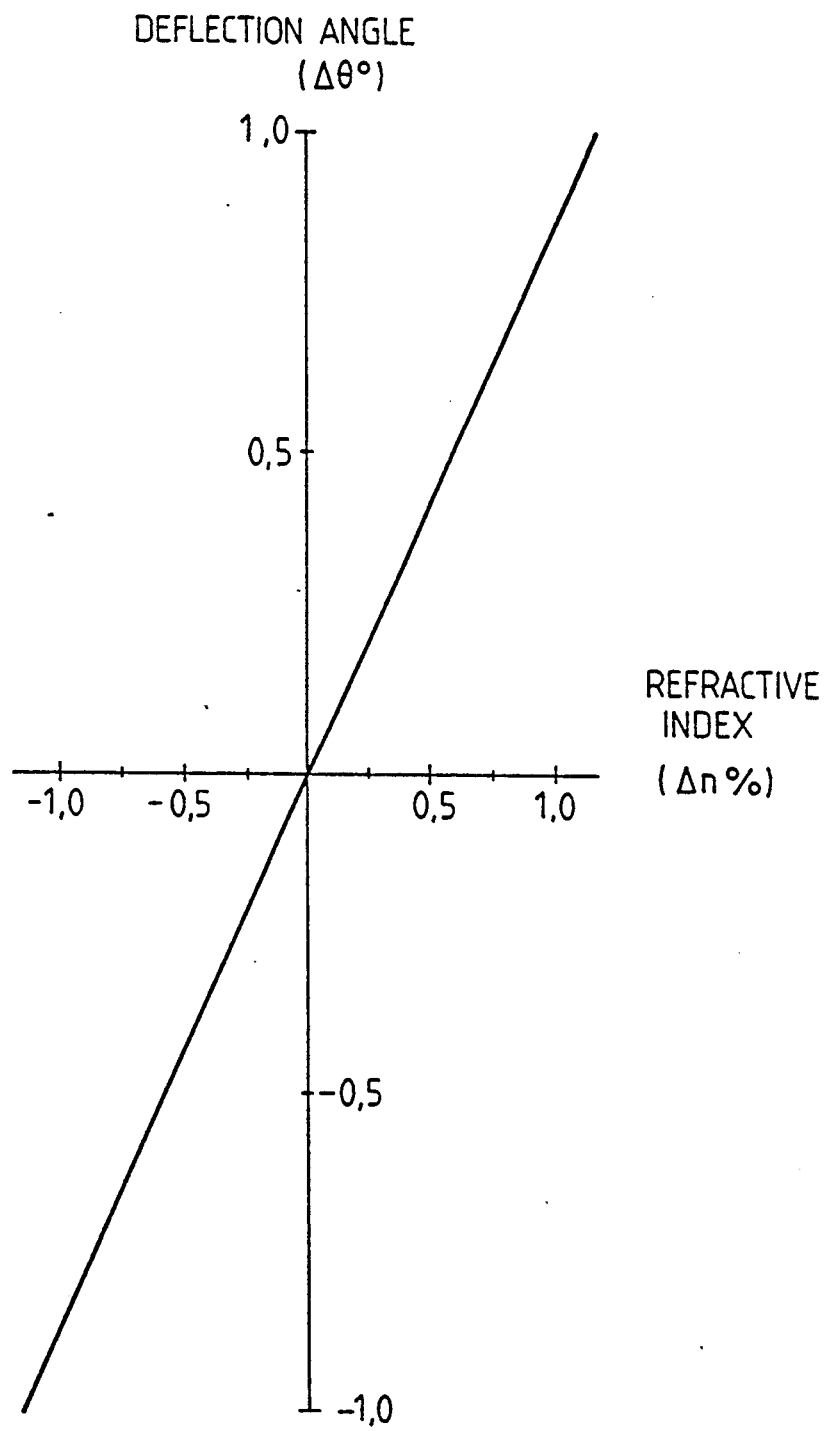
FIG. 6 is a diagram illustrating the correlation between the refractive index of the optical deflector according to the invention and the beam deflection angle.

The beam deflecting characteristics for the device of FIG. 1 are shown in FIG. 6, and display ideal linearity of change in the reflected beam angle with respect to change in the refractive index. The beam deflection operation is obtained by changing the external electrical bias from 1 Volt to −1.4 Volt in a device having a Schottky electrode.

The refractive index changes sufficiently to provide a range of ±1 degree for a 90-Å modulation-doped MQW. As the incident angle to the grating is 45°, the output beam angle is −76.03° for the $TE_0$ mode, where the thickness of the waveguide is 1 $\mu$m.

EXAMPLE 2

Figure 7:
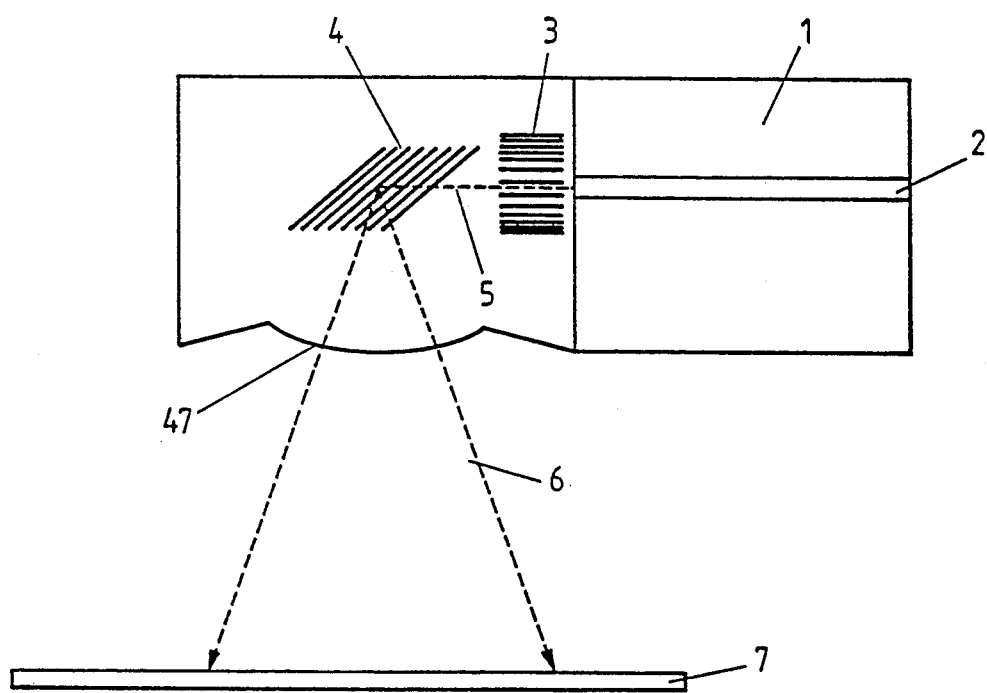
FIG. 7 is a cross-sectional view illustrating a third embodiment of the invention.

FIG. 7 illustrates an embodiment of the invention similar to that of FIG. 1 wherein only the wavelength of the laser diode and the shape of beam output edge 47 are changed. The laser wavelength is 720 nm with a 30-mA threshold current. The beam output edge has a cylindrical shape, having a center of curvature at point 104 where the laser beam is deflected by the grating. This shape may be obtained by reactive ion etching using $Cl_2$ gas.

A beam deflection speed of 1 GHz was obtained for a ±0.8° beam deflection angle.

EXAMPLE 3

The laser-beam deflecting device described in example 2 is used in a laser beam printer. The beam is deflected in a direction perpendicular to the flow of text. A rotating polygonal mirror is employed to deflect the beam along the flow of text. The combination of these two deflectors permits operation at a speed twice that permitted by use of conventional one-directional deflectors.

Thus the present invention provides a non-mechanical optical beam deflector that can operate at a deflection frequency of more than one Gigahertz. The device may be effectively utilized in laser beam printers as well as in optical routing devices, which play an important role in optical data processing. The beam shape and linearity of the deflection angle are both excellent in comparison with prior art devices.

What is claimed is:

1. An apparatus for changing the direction of an optical beam, comprising:
   a thin film grating deflector including a plurality of quantum wells;
   optical energy providing means for providing optical energy to strike said deflector at a first angle with respect to gratings of said deflector and to exit said deflector at a second angle with respect to said gratings; and
   voltage applying means for applying a voltage to said deflector to thereby vary the second angle.

2. The apparatus of claim 1 wherein said optical energy providing means comprises: a diode laser; and means for coupling energy from said diode laser to said grating deflector.

3. The apparatus of claim 1 further comprising: collimator means disposed between said optical energy providing means and said grating deflector for collimating said optical energy.

4. The apparatus of claim 1 wherein said quantum wells are comprised of GaAs and are separated by barriers of AlGaAs.

5. The apparatus of claim 1 wherein said quantum wells are modulation doped.

6. The apparatus of claim 1 wherein said quantum wells are approximately 9 Å thick and are separated by barriers approximately 100 Å thick.

7. The apparatus of claim 1 wherein said modulation doped quantum wells are formed as a superlattice structure.

8. The apparatus of claim 1 wherein said thin film grating deflector comprises a planar waveguide.

9. The apparatus of claim 8 wherein said optical energy providing means provides said energy to said grating deflector in a first direction and said optical energy is deflected by said grating deflector in a second direction, said first direction and said second direction defining a plane in which said waveguide is disposed.

10. The apparatus of claim 8 wherein said quantum wells are stacked in a direction perpendicular to a plane of said planar waveguide.

11. The apparatus of claim 1 wherein said thin film grating deflector, and said optical energy producing means are integrated into a single chip.

12. The apparatus of claim 11 wherein said single chip also has, integrated therein, said voltage applying means.

13. The apparatus of claim 1 wherein said voltage applying means includes one of a Schottky contact and a pn junction.

14. The apparatus of claim 1 wherein said optical energy providing means causes said optical energy to strike said grating deflector at an incident angle of approximately 45 degrees.

15. An apparatus for changing the direction of an optical beam, comprising:
   a thin film grating deflector;
   optical energy providing means for providing optical energy to strike said deflector at a first angle with respect to gratings of said deflector and to exit said deflector at a second angle with respect to said gratings; and
   voltage applying means for applying a voltage to said deflector to thereby vary the second angle; said thin film grating deflector, said optical energy producing means and said voltage applying means being integrated into a single chip.

16. The apparatus of claim 1 wherein said grating deflector comprises a plurality of quantum wells.

17. An apparatus for changing the direction of an optical beam, comprising:
   a thin film grating deflector;
   optical energy providing means for providing optical energy to strike said deflector at a first angle with respect to gratings of said deflector and to exit said deflector at a second angle with respect to said gratings; and
   voltage applying means for applying a voltage to said deflector to thereby vary the second angle; said voltage applying means including one of a Schottky contact and a pn junction.

18. The apparatus of claim 17 wherein said grating deflector comprises of plurality of quantum wells.

* * * * *